(12) United States Patent
Sawyer

(10) Patent No.: US 8,809,135 B2
(45) Date of Patent: Aug. 19, 2014

(54) MEMS DEVICE AND INTERPOSER AND METHOD FOR INTEGRATING MEMS DEVICE AND INTERPOSER

(75) Inventor: William D. Sawyer, Arlington, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 0 days.

(21) Appl. No.: 12/697,713

(22) Filed: Feb. 1, 2010

(65) Prior Publication Data

US 2011/0001198 A1    Jan. 6, 2011

Related U.S. Application Data

(60) Continuation of application No. 11/857,720, filed on Sep. 19, 2007, now Pat. No. 7,655,538, which is a division of application No. 10/889,868, filed on Jul. 13, 2004, now Pat. No. 7,381,630, which is a continuation-in-part of application No. 10/642,315, filed on Aug. 15, 2003, now Pat. No. 6,946,314, which is a continuation-in-part of application No. 10/038,890, filed on Jan. 2, 2002, now Pat. No. 6,673,694.

(60) Provisional application No. 60/403,796, filed on Aug. 15, 2002, provisional application No. 60/259,282, filed on Jan. 2, 2001.

(51) Int. Cl.
*H01L 21/58* (2006.01)
*B81B 7/00* (2006.01)

(52) U.S. Cl.
CPC ....... *B81B 7/0048* (2013.01); *B81B 2203/0307* (2013.01)
USPC ............................................. 438/159; 216/2

(58) Field of Classification Search
USPC ................................................ 438/159; 216/2
See application file for complete search history.

(56) References Cited

U.S. PATENT DOCUMENTS 3,922,705 A    11/1975   Yerman
4,079,508 A     3/1978   Nunn (Continued)

FOREIGN PATENT DOCUMENTS

EP    1 058 143      12/2000
JP    10-178183       6/1998

(Continued)

OTHER PUBLICATIONS

Burrer, Chr. et al. "High-precision BESOI-based resonant accelerometer", Sensors and Actuators A 50 (1995) pp. 7-12.

(Continued)

*Primary Examiner* — George Fourson, III
(74) *Attorney, Agent, or Firm* — Foley & Lardner LLP

(57) ABSTRACT

A method for producing Microelectromechanical Systems (MEMS) and related devices using Silicon-On-Insulator (SOI) wafer includes providing an SOI wafer, performing a mesa etch to at least partially define the MEMS device, bonding the SOI wafer to an interposer by direct boding, removing the handle layer of the SOI wafer, removing the oxide layer of the SOI wafer, and further etching the device layer of the SOI wafer to define the MEMS device. A structure manufactured according to the above described processes includes an interposer comprising an SOI wafer and a MEMS device mounted on the interposer. The MEMS device comprises posts extending from a silicon plate. The MEMS device is directly mounted to the interposer by bonding the posts of the MEMS device to the device layer of the interposer.

8 Claims, 8 Drawing Sheets

(56) References Cited

U.S. PATENT DOCUMENTS

| | | | |
|---|---|---|---|
| 5,488,012 A | 1/1996 | McCarthy | |
| 5,501,893 A | 3/1996 | Laermer et al. | |
| 5,760,443 A | 6/1998 | McCarthy | |
| 6,077,721 A | 6/2000 | Fukuda et al. | |
| 6,105,427 A | 8/2000 | Stewart et al. | |
| 6,140,755 A * | 10/2000 | Neukermans et al. | 313/420 |
| 6,168,395 B1 * | 1/2001 | Quenzer et al. | 417/413.3 |
| 6,171,881 B1 | 1/2001 | Fujii | |
| 6,187,110 B1 * | 2/2001 | Henley et al. | 148/33.2 |
| 6,225,145 B1 * | 5/2001 | Choi et al. | 438/120 |
| 6,252,294 B1 | 6/2001 | Hattori et al. | |
| 6,277,666 B1 * | 8/2001 | Hays et al. | 438/50 |
| 6,291,875 B1 | 9/2001 | Clark et al. | |
| 6,296,779 B1 * | 10/2001 | Clark et al. | 216/66 |
| 6,356,689 B1 * | 3/2002 | Greywall | 385/52 |
| 6,423,563 B2 | 7/2002 | Fukads | |
| 6,431,714 B1 | 8/2002 | Sawada et al. | |
| 6,433,401 B1 | 8/2002 | Clark et al. | |
| 6,458,615 B1 | 10/2002 | Fedder et al. | |
| 6,555,404 B1 * | 4/2003 | Kubena et al. | 438/22 |
| 6,580,138 B1 * | 6/2003 | Kubena et al. | 257/415 |
| 6,630,367 B1 * | 10/2003 | Kubena et al. | 438/48 |
| 6,673,694 B2 | 1/2004 | Borenstein | |
| 6,674,141 B1 * | 1/2004 | Kubena et al. | 257/417 |
| 2002/0081821 A1 | 6/2002 | Cabuz et al. | |
| 2002/0190319 A1 | 12/2002 | Borenstein | |

FOREIGN PATENT DOCUMENTS

| | | |
|---|---|---|
| JP | 11-261080 | 9/1999 |
| JP | 2001-124794 | 5/2001 |
| JP | 2002-521695 | 7/2002 |
| JP | 2002-357777 | 12/2002 |
| JP | 2003-302586 | 10/2003 |
| WO | WO-00/07028 | 2/2000 |
| WO | WO 00/78667 | 12/2000 |
| WO | WO-02/10063 | 2/2002 |
| WO | WO-02/054475 | 7/2002 |
| WO | WO-03/068669 | 8/2003 |
| WO | WO-03/102631 | 12/2003 |
| WO | WO-2004/017371 | 2/2004 |
| WO | WO-2004/033365 | 4/2004 |

OTHER PUBLICATIONS

Martin A. Schmidth, "Wafer-to-Wafer Bonding for Microstructure Formation", Proceedings of the IEEE, vol. 86, No. 8, Aug. 1998.

Moore DF, "Silicon-on insulator material for sensors and accelerometers" Silicon Fabricated Inertial Instruments, Sep. 1-Sep. 5 (Dec. 1996).

Plaza, J.A., et al., "Simple Technology for Bulk Accelerometer Based on Bond and Etch Back Silicon on Insulator Wafers", Sensors and Actuators A 68 (1998), pp. 299-302.

Syms RRA et al., "Surface tension powered self-assembly of 3D MOEMS devices using DRIE of bonded silicon-on-insulator wafers." IEEE Seminar on Demonstrated Micromachining Technologies for Industry, Jan. 1-Jan. 6 (Mar. 2000).

Warren, K., "Navigation Grade Silicon Accelerometers with Sarificially Etched SIMOX and BESOI Structure", Solid-State Sensor and Actuator Workshop, Jun. 13-16, 1994, pp. 69-72.

Yamamoto T. et al. "Capacitive accelerometer with high aspect ratio single crystalline silicon microstructure using SOI structure with polysilicon-based interconnect technique." Micro Electro Mechanical Systems, 515-519 (Jan. 2000).

Examination Report for Canadian Patent Application No. 2,433,738, dated Dec. 1, 2008.

Examination Report for Canadian Patent Application No. 2,433,738, dated May 4, 2010.

Communication pursuant to Article 94(3) EPC for European Patent Application No. 03 754 388.1 mailed Apr. 23, 2012.

Communication pursuant to Article 94(3) EPC for European Patent Application No. 05 857 281.9 mailed Jun. 6, 2013.

Communication pursuant to Article 94(3) EPC for European Patent Application No. 02 708 936.6 mailed Apr. 23, 2012.

Decision of Dismissal of Amendment for Japanese Patent Application No. 2007-521586 dated Jan. 8, 2013.

Examiner Report for Canadian Patent Application No. 2573907 dated Dec. 31, 2012.

Extended European Search Report for European Patent Application No. 05857281.9 dated Oct. 2, 2012.

Henri Jansen et al., "A survey on the reactive ion etching of silicon in microtechnology," Journal of Micromechanics & Microengineering, Institute of Physics Publishing, Bristol, GB, vol. 6, No. 1, Mar. 1, 1996, pp. 14-28.

Invitation pursuant to Rule 62a(1) EPC for European Patent Application No. 05857281.9 dated Jun. 15, 2012.

Notice of Acceptance for Australian Patent Application No. 2009248425 dated Dec. 20, 2012.

Notice of Reasons for Refusal for Japanese Patent Application No. 2007-521586 DTD Mar. 6, 2012 (English translation).

Notice of Reasons for Refusal in Patent Application No. 2007-521586 dated May 17, 2011.

Office Action in Japanese Patent Application No. 2012-196273 dated Dec. 10, 2013.

Office Action in JP 2007-521586 dated Nov. 2, 2011.

Office Action in U.S. Appl. No. 10/889,868 Dtd Mar. 20, 2007.

Office Action in U.S. Appl. No. 11/231,103 Dtd Sep. 14, 2006.

Office Action in U.S. Appl. No. 11/857,720 Dtd Feb. 4, 2008.

US Notice of Allowance in U.S. Appl. No. 11/231,103 dated Mar. 19, 2007.

US Notice of Allowance in U.S. Appl. No. 10/889,868 dated Feb. 1, 2008.

* cited by examiner

MEMS DEVICE AND INTERPOSER AND METHOD FOR INTEGRATING MEMS DEVICE AND INTERPOSER

CROSS-REFERENCE TO RELATED APPLICATIONS

This application is a continuation application of U.S. patent application Ser. No. 11/857,720, filed on Sep. 19, 2007, which is divisional of U.S. patent application Ser. No. 10/889,868, filed on Jul. 13, 2004, which is a continuation in part of U.S. patent application Ser. No. 10/642,315, filed on Aug. 15, 2003, which is a continuation in part of U.S. patent application Ser. No. 10/038,890, filed on Jan. 2, 2002. U.S. patent application Ser. No. 10/642,315 also claims priority to U.S. Provisional Patent Application Ser. No. 60/403,796, filed on Aug. 15, 2002. U.S. application Ser. No. 10/038,890 claims priority to U.S. Provisional Patent Application Ser. No. 60/259,282, filed on Jan. 2, 2001. The entire contents of the above applications are incorporated herein by reference.

FIELD OF THE INVENTION

The invention relates to Microelectromechanical Systems (MEMS) devices and methods for integrating the MEMS devices, in particular, to an assembly having a MEMS device directly bonded to an interposer and methods for integrating the assembly.

BACKGROUND OF THE INVENTION

A Microelectromechanical Systems (MEMS) device, such as a MEMS device used in a gyroscope or an accelerometer, is typically sensitive to thermal and mechanical stresses. In the prior art, the MEMS device is directly mounted to the floor or substrate of a ceramic chip carrier package. The MEMS device typically is manufactured from silicon. The material from which the package is manufactured typically does not provide a good match with the material of the MEMS device in terms of their respective coefficients of thermal expansion. Furthermore, the MEMS device typically is bonded to the package by brazing. The braze materials may impart similar thermal stress to the MEMS device.

One type of prior art device uses an interposer to isolate the MEMS device from the package. The interposer is a device upon which a MEMS device is mounted. The interposer is in turn mounted in the MEMS package. The function of the interposer is to isolate the MEMS device from the mechanical and thermal stress exerted by the package. FIG. 1 illustrates a schematic structure of the package, the interposer, and the MEMS device. The MEMS device and the interposer are manufactured as two separate entities. The MEMS device is subsequently brazed to the interposer using a gold and/or tin alloy. One disadvantage of the prior art structure is that the braze materials may impart thermal stresses to the MEMS device. Furthermore, the braze materials may creep over time. This negatively affects the long term performance stability and reliability of the MEMS device.

Moreover, in the prior art device, the MEMS device typically includes a substrate and a silicon device attached to the substrate. The substrate is bonded to the interposer by brazing. The substrate is manufactured from glass or other materials. In the situation that the substrate is not manufactured from the same material as the silicon device, the substrate may also impart thermal stresses to the silicon device. This may degrade the performance of the whole system.

FIG. 2 illustrates a traditional method of producing the MEMS device, in which the interposer and the MEMS device are manufacture as two separate entities. The process starts from the top of the figure and continues to the bottom of the figure. The traditional process of making an interposer starts with a double-side polished silicon wafer 10. Oxide layers 12 are grown on both sides of the silicon wafer 10. On a top side of the wafer 10, the oxide layer is selectively etched, and ohmic contacts 14 and braze materials 16 are deposited in the etched area. The MEMS device as denoted by number 22 generally includes a silicon device 24 attached to a substrate 26. Typically, the silicon device 24 is attached to the substrate 26 by anodic bonding. The substrate 26 is then attached to the interposer 10 by brazing. The traditional materials used in brazing are gold and tin. The brazing materials between the substrate 26 and the interposer 10 may creep over time, and that may have negative effects on the performance of the MEMS device.

What is needed is a structure having a MEMS device and an interposer, wherein the interposer has a thermal expansion well-matched to the MEMS device. There is a further need of a method of manufacturing the structure.

SUMMARY OF THE INVENTION

The present invention provides an assembly comprising a Microelectromechanical Systems (MEMS) device and an interposer that reduces the thermal and mechanical stresses exerted from the interposer or a package of the assembly to the MEMS device, and a method for manufacturing the MEMS device and the interposer assembly.

According to one aspect of the present invention, the process is based on a Bonded and Etch Back Silicon-On-Insulator (referred to hereinbelow as BESOI) method. The BESOI method includes providing a Silicon-On-Insulator (SOI) wafer, which has (i) a handle layer, (ii) a dielectric layer, which preferably is a silicon dioxide ($SiO_2$) layer, and (iii) a device layer. The device layer is first patterned by mesa etch. After the device layer is patterned, the SOI wafer is bonded to a substrate with the patterned device layer facing the substrate. The handle layer and the dielectric layer of the SOI wafer are removed by etching. The device layer is further etched to define the MEMS device. In the BESOI method, the structure etching is performed after the dielectric $SiO_2$ layer is removed.

According to another aspect of the present invention, the method comprises manufacturing an interposer and manufacturing a MEMS device together with bonding the MEMS device with the interposer. The process of manufacturing the interposer starts from obtaining an SOI wafer. A thin oxide layer is formed on a bottom surface of the handle layer of the SOI wafer. The oxide layer is etched to define holes or lines for contacts or interconnect lines. Ohmic contacts and/or interconnect lines are then formed on the device layer and the handle layer of the SOI wafer by metal deposition. In next step, the device layer of the SOI wafer is patterned to define electrically conductive areas. In one preferred embodiment, at least one deep trench through the device layer and the oxide layer is formed, separating the device layer to at least two active areas. The device layer of the SOI wafer may be further patterned and metallized to form interconnect lines for connecting the ohmic contacts.

The process of forming the MEMS device together with bonding the MEMS device to the interposer wafer also starts from obtaining an SOI wafer according to one preferred embodiment of the present invention. The device layer of the SOI wafer may have a thickness and may be doped as required by the MEMS device that the wafer is going to form. An etch is performed on the device layer to at least partially define the MEMS device. Preferably, a mesa etch is performed to define structural posts. In an alternative embodiment, the structural posts may be defined on the device layer of the interposer wafer by a mesa etch. In the next step, the wafer is mounted to the interposer wafer by bonding the top surface of the posts to the top surface of the device silicon layer of the interposer wafer, preferably by silicon direct bonding. After the two wafers are bonded together, the handle layer of the MEMS device wafer becomes the top layer of the assembly. The top handle layer of the MEMS device wafer is then etched away preferably by a liquid etch, which stops on the upper surface of the oxide layer, thus protecting the underneath device silicon layer from being damaged by the etchant. The oxide layer of the device wafer is removed by a wet or dry etch. The etchant used to remove the oxide layer preferably has a high selectivity of $SiO_2$ over silicon, so that the underneath silicon will not be attacked. In one alternate embodiment, the device layer of the device wafer may need to be further patterned, preferably by inductively coupled plasma (ICP), to define the MEMS device. The MEMS device can be used to form a gyroscope or an accelerator device. In these embodiments, the device layer of the device wafer is etched to define a proof mass. The bottom interposer wafer may be further etched preferably by inductively coupled plasma (ICP) to define the structure of the interposer.

The present disclosure also provides a structure manufactured according to the above described process. The structure includes an interposer comprising an SOI wafer and a MEMS device mounted on the interposer. The MEMS device comprises posts extending from a silicon plate. The MEMS device is directly mounted to the interposer by bonding the posts of the MEMS device to the device layer of the interposer.

The present disclosure further provides a method for etching an element in a structure, the structure including (i) a substrate, (ii) at least one device disposed on the substrate, and (iii) the element attached to the substrate and extending over the device. According to one preferred embodiment, the method comprises: depositing and patterning resist on the element, such that at least one selected area, which is above the device, is covered by the resist, and etching the element, whereby the at least one selected area of the element covered by the resist is protected by the resist from being etched, and thus the device under the resist-covered area is protected from being etched.

DETAILED DESCRIPTION OF PREFERRED EMBODIMENTS

The present invention provides a configuration for a MEMS device, which has a silicon MEMS device directly bonded to an interposer wafer without the intermediate substrate and the brazing materials.

According to one preferred embodiment of the present invention, the process is based on a Bonded and Etch Back Silicon-On-Insulator (referred to hereinbelow as BESOI) method. BESOI is a fabrication method for producing MEMS and related devices using Silicon-On-Insulator (SOI) materials. The method includes providing a Silicon-On-Insulator (SOD wafer, which has (i) a handle layer, (ii) a dielectric layer, which preferably is a silicon dioxide, on the handle layer ($SiO_2$) layer, and (iii) a device layer on the dielectric layer. The device layer is first patterned by mesa etch. After the device layer is patterned, the SOI wafer is bonded to a substrate with the patterned device layer facing the substrate. The handle layer and the dielectric layer of the SOI wafer are then removed by etching. The device layer is further etched to define the MEMS device. In the BESOI method, the structure etching is performed after the dielectric $SiO_2$ layer is removed. One of the advantages of the BESOI process is that the $SiO_2$ layer functions as an etching stop when the handle layer is removed by wet or dry etching, thus preventing the underneath device layer from being damaged by the etchant.

Figure 1:
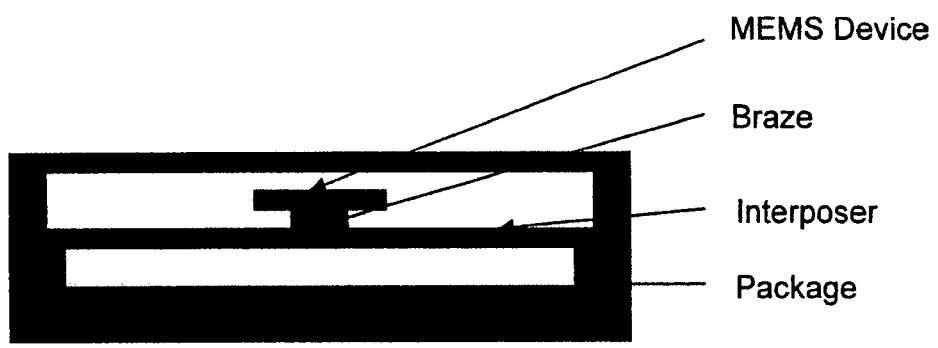
FIG. 1 is a schematic side view showing a structure of a prior art MEMS device assembly.
Figure 2:
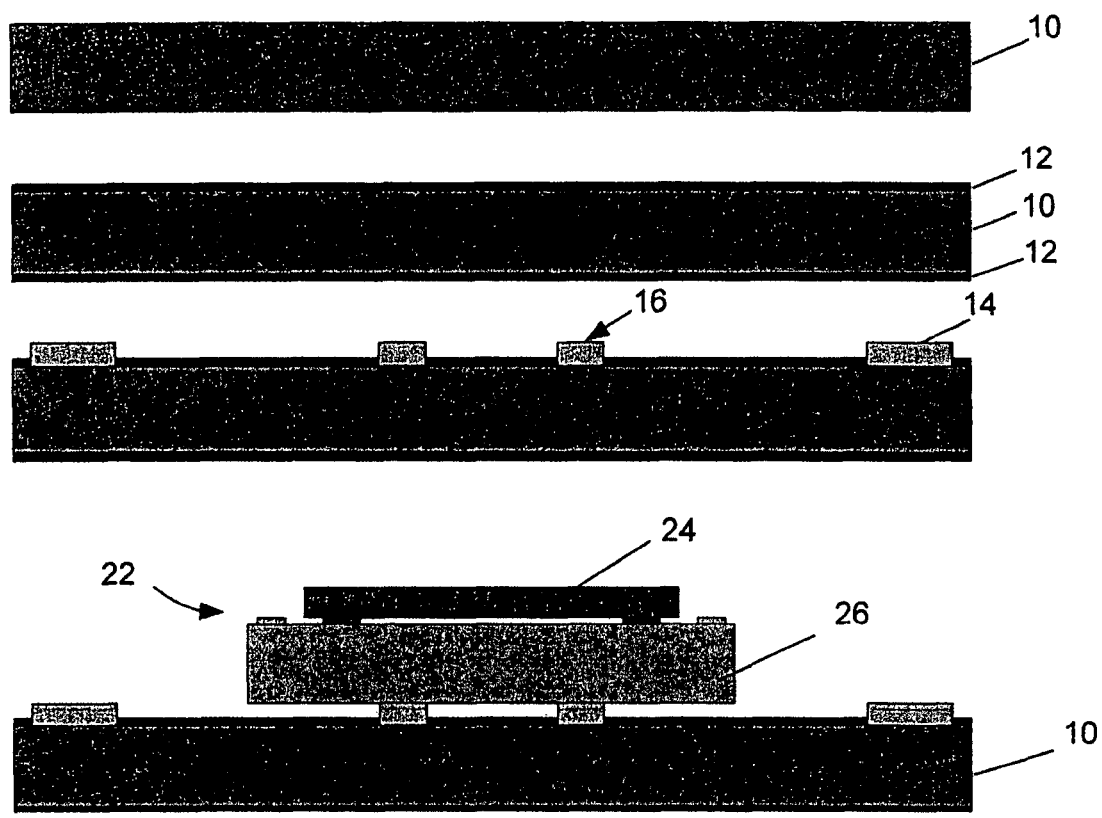
FIG. 2 is a schematic side view showing a prior art process of manufacturing a MEMS device assembly.
Figure 3:
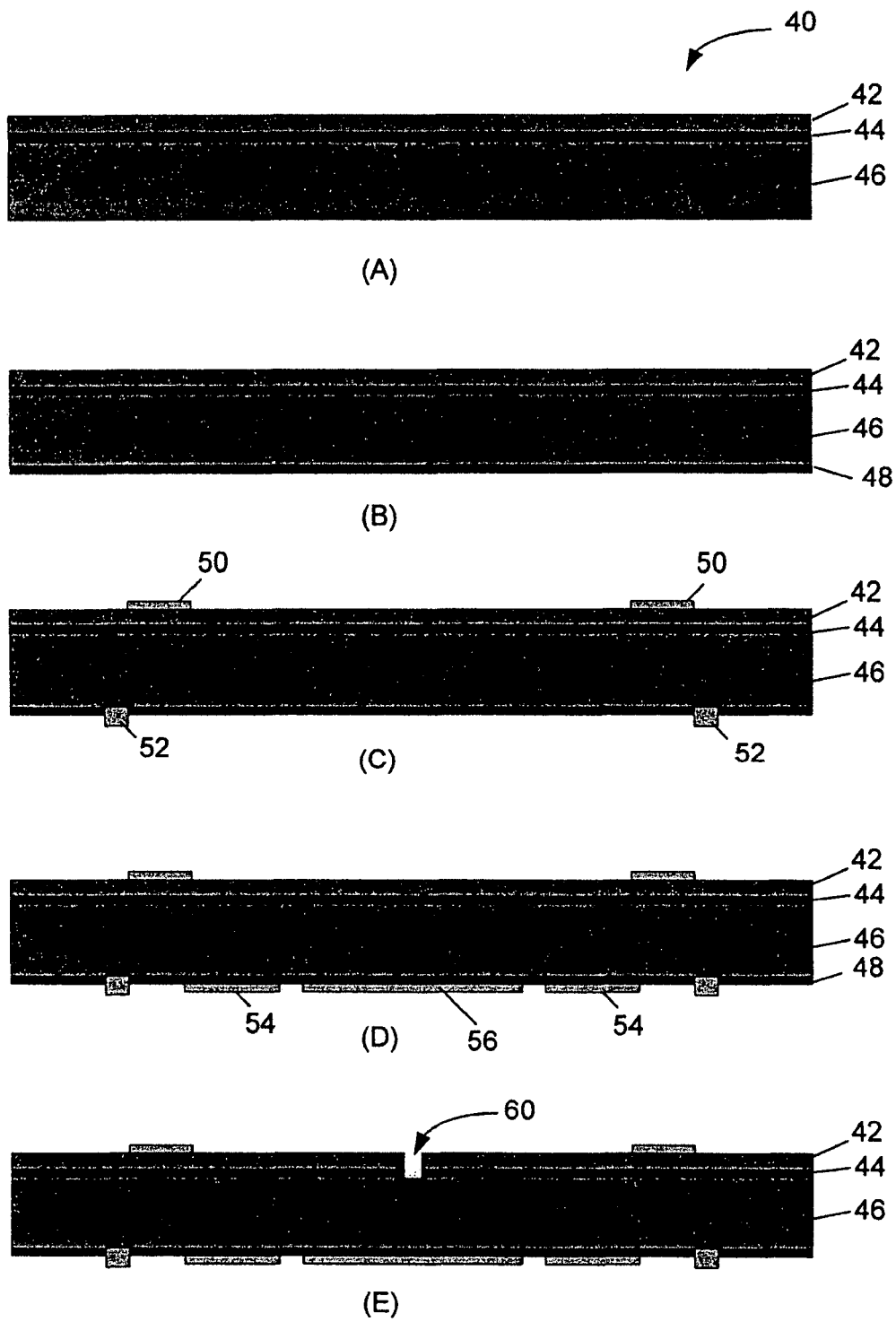
FIG. 3 is a schematic side view showing a process of manufacturing an interposer wafer according to one preferred embodiment of the present invention.
Figure 4:
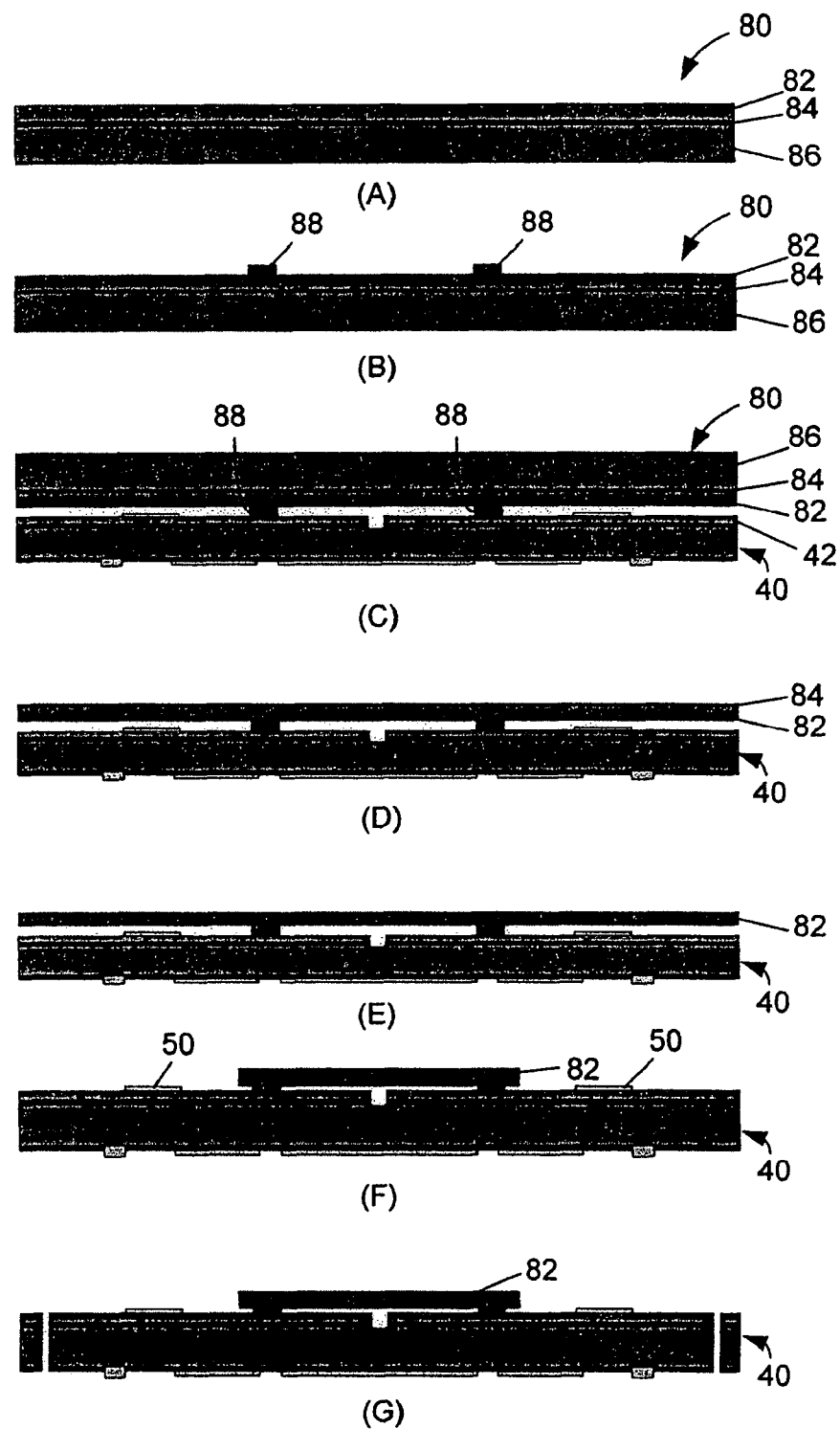
FIG. 4 is a schematic side view showing a process of manufacturing a MEMS device together with bonding the MEMS device to the interposer wafer according one preferred embodiment of the present invention.

FIGS. 3 and 4 illustrate a process of manufacturing the MEMS device and the interposer according to the present disclosure. Those figures schematically show side views of the wafers in each fabrication step. The illustrated side views do not represent the whole structure of the wafer. For example, the number of ohmic contacts on the device layer of the wafer may not be limited to two. There may be more contacts or more other devices deposited on the wafer, that are not shown in FIGS. 3 and 4.

FIG. 3 illustrates a process of fabricating a wafer that will be used to form the interposer according to one aspect of the present invention. As shown in FIG. 3, the process starts from (A) at the top of the figure and continues to (E) at the bottom of the figure. The process starts from constructing an interposer with an SOI wafer 40. As shown in (A), the SOI wafer includes a device silicon layer 42, a dielectric layer 44, which preferably is a silicon dioxide ($SiO_2$) layer, and a handle silicon layer 46. The device layer 42 preferably is heavily doped, so that it is sufficiently conductive. In an alternate embodiment, the handle layer 46 may be heavily doped. The dopant type and concentration can be customized based on a user's need. Such SOI wafers are commercially available in the market.

A thin oxide layer 48, preferably about 1 μm thick, is grown on a bottom side of the handle layer 46, as shown in (B). The thin oxide layer 48 is etched defining holes through the thin oxide layer 48 and ohmic contacts 52 are deposited at the hole areas. More ohmic contacts 50 are deposited on the top of the device layer 42, as shown in (C). The ohmic contacts 50 and 52 are preferably formed by metal, exemplary metals including Al, Ti, Pt, and Au. Conventional metallization processes such as physical vapor deposition (PVD) and chemical vapor deposition (CVD) can be used for depositing the metal to form the contacts. Preferably, the contacts 50 and 52 are formed by sputter deposition. In next step, as shown in (D), heaters 54 and sensor 56 are formed at the bottom surface of the thin oxide layer 48. Preferably the heaters 54 are formed by sputter deposition of Ti and Pt, and the sensor 56 is formed by sputter deposition of Ti, Pt, and Au. The contacts 50, 52, the heaters 54, and the sensor 56 can be formed by one or more metal layers as listed above, or other electrically conductive materials, such as highly doped polycrystalline silicon. In next step, as shown in (E), the device layer 42 of the wafer 40 is patterned to define electrically conductive areas. In the exemplary embodiment in (E), a deep trench 60 is formed through the device layer 42 and the oxide layer 44, separating the device layer 42 to two active areas, which are not electrically conductive with each other. In one preferred embodiment, in forming the trench 60, a highly anisotropic etch, for example a Bosch etch, a reactive ion etch (RIE), or an inductively coupled plasma (ICP) etch, preferably performed in a Surface Technology Systems (STS) tool, is used to etch through the device silicon layer 42 to the oxide layer 44. Then a reactive ion etching (RIE) or other suitable etch process is used to etch through the oxide layer 44. In RIE, a high selectivity of $SiO_2$ over silicon can be obtained by choosing the proper etch chemistry. The device layer 42 of the wafer 40 may be further patterned and metallized to form interconnect lines for connecting the ohmic contacts.

FIG. 4 illustrates a process of forming a MEMS device, followed by bonding the MEMS device to the interposer wafer 40, which has been formed in the process in FIG. 3. The device forming and bonding-to-interposer process starts from (A) at the top of FIG. 4 and continues to (G) at the bottom of the figure. The process starts by obtaining or providing an SOI wafer 80, which is used to form the MEMS device. The SOI wafer 80 includes a device silicon layer 82, a dielectric layer 84, which preferably is a silicon dioxide ($SiO_2$) layer, and a handle silicon layer 86. The device layer 82 may be doped as required by the MEMS device that the wafer 80 is to form. As shown in (B), an etch is performed on the device layer 82 to at least partially define the MEMS device. In the exemplary embodiment shown in FIG. 4, a mesa etch is performed to define structural posts 88. Preferably, one or more posts 88 are defined on the device layer 82. In the next step, as shown in (C), the wafer 80 is mounted to the wafer 40 by bonding the top surface of the posts 88 to the top surface of the device silicon layer 42 of the wafer 40. The bonding technology will be presented in more detail below. In (C), after the two wafers 80 and 40 are bonded together, the handle layer 86 of the wafer 80 becomes the top layer of the device. From (C) to (D) in FIG. 4, the top handle layer 86 is etched away preferably by a liquid etch, which stops on the upper surface of the oxide layer 84, thus protecting the underneath device silicon layer 82 from being damaged by the etchant. From (D) to (E), the oxide layer 84 is removed by a wet or dry etch, or a combination of wet and dry etch. The etchant used to remove the oxide layer 84 preferably has a high selectivity of $SiO_2$ over silicon, so that the underneath silicon will not be attacked. From step (E) to (F), the device layer 82 of the wafer 80 is further patterned to define the MEMS device. In a preferred form, an inductively coupled plasma (ICP) etching performed in a Surface Technology Systems (STS) tool is used to define the MEMS device on the device layer 82. By way of example, the MEMS device can be used to form a gyroscope or an accelerator device. Other MEMS devices may also be formed. In the exemplary gyroscope and accelerometer embodiments, the device layer 82 is etched to define a proof mass as shown in (F). In step (G), the bottom wafer 40 is further etched preferably by inductively coupled plasma (ICP) to define the structure of the interposer and/or to separate the individual device from the wafer.

The device fabricated by the process described above has the MEMS device 80 and the interposer 40 bonded by silicon direct bond, without brazing materials or a substrate layer between the top layer 82 of MEMS device 80 and the top layer 42 of the interposer 40 as required in the prior art device for bonding the MEMS device to the interposer. The device fabricated by the process of the present disclosure has better stability and reliability over the lifetime of the device. Furthermore, the present process results in the MEMS device being directly bonded to the interposer without using an intermediate substrate, thus reducing the thermal mass of the MEMS device and increasing the thermal stability of the combined interposer and MEMS structure. The number of processing steps to create the combined interposer and the MEMS structure is less than the number of steps needed to manufacture both items separately, and then bond them together.

It is preferred that the MEMS device 80 is bonded to the interposer 40 by silicon direct bonding. Direct bonding, which is also called silicon fusion bonding, is a wafer-to-wafer bonding technology known in the art. The process includes three basic steps: surface preparation, contacting, and annealing. The surfaces that will be bonded together must be flat and smooth. The wafers to be bonded each should have a total thickness variation (TTV) less than 3 μm, and preferably less than 1 μm. The wafer surfaces are cleaned and processed in a clean room to form two hydrated surfaces. After surface preparation, the two wafers are contacted in a clean environment by pressing the two cleaned surfaces together. The next step is an elevated temperature anneal of the contacted wafers, preferably at a high temperature between 800° C. to 1200° C. Alternatively, the contacted wafers can be annealed at a lower temperature, preferably over a long time period. The bond strength at the interface between two wafers can be measured by various techniques, for example, a tensile/shear test. The bonding method that can be used to bond the two wafers is not limited to direct bonding. Alternatives to direct bonding include but are not limited to anodic bonding, intermediate-layer bonding, and the like. A wide range of intermediate layers and bonding techniques can be used in intermediate-layer bonding, for example, eutectic bonding using Au thin films, solder bonding, polymer bonding, low melting temperature glasses bonding, and thermocompression bonding.

Figure 5:
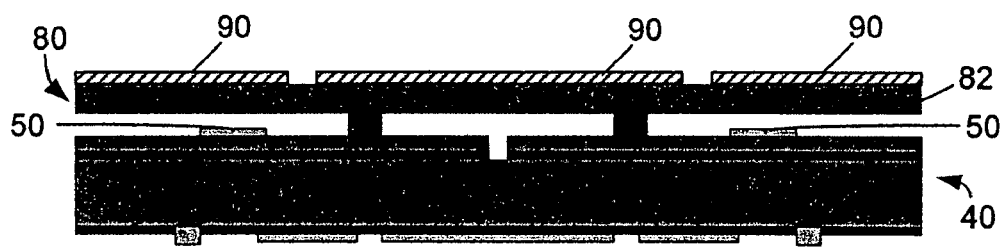
FIG. 5 is a schematic side view showing a process of manufacturing a structure according to one preferred embodiment of the present invention.

In the step when the top device silicon layer 82 is etched to define the MEMS device (e.g. the proof mass in gyroscope, accelerometer, or other devices), as shown from (E) to (F) in FIG. 4, the interposer 40, especially the contacts 50 on the top surface of the interposer 40, may be damaged during the etching process if without protection. Therefore, in another preferred embodiment, as shown in FIG. 5, a layer of resist 90 is deposited on the top surface of the device layer 82 at the areas above the contacts 50 or other devices on the interposer 40. The resist 90 can be the same resist that is deposited on the top surface of device layer 82 during the process of defining the MEMS device, in other words, after the oxide layer 84 is removed, a layer of resist 90 is deposited on the surface of the device layer 82, and in a following photolithography process, the resist 90 is patterned for etching the device layer 82 to define the MEMS device and also to protect the underneath contacts 50 and other devices on the top of interposer 40. FIG. 5 shows a schematic view of the wafer 80 after the resist 90 is patterned by the photolithography process. As seen from the figure, in the following etching process, preferably an inductively coupled plasma (ICP) etching, the contacts 50 on the interposer 40 are protected from being etched by the plasma.

Figure 6:
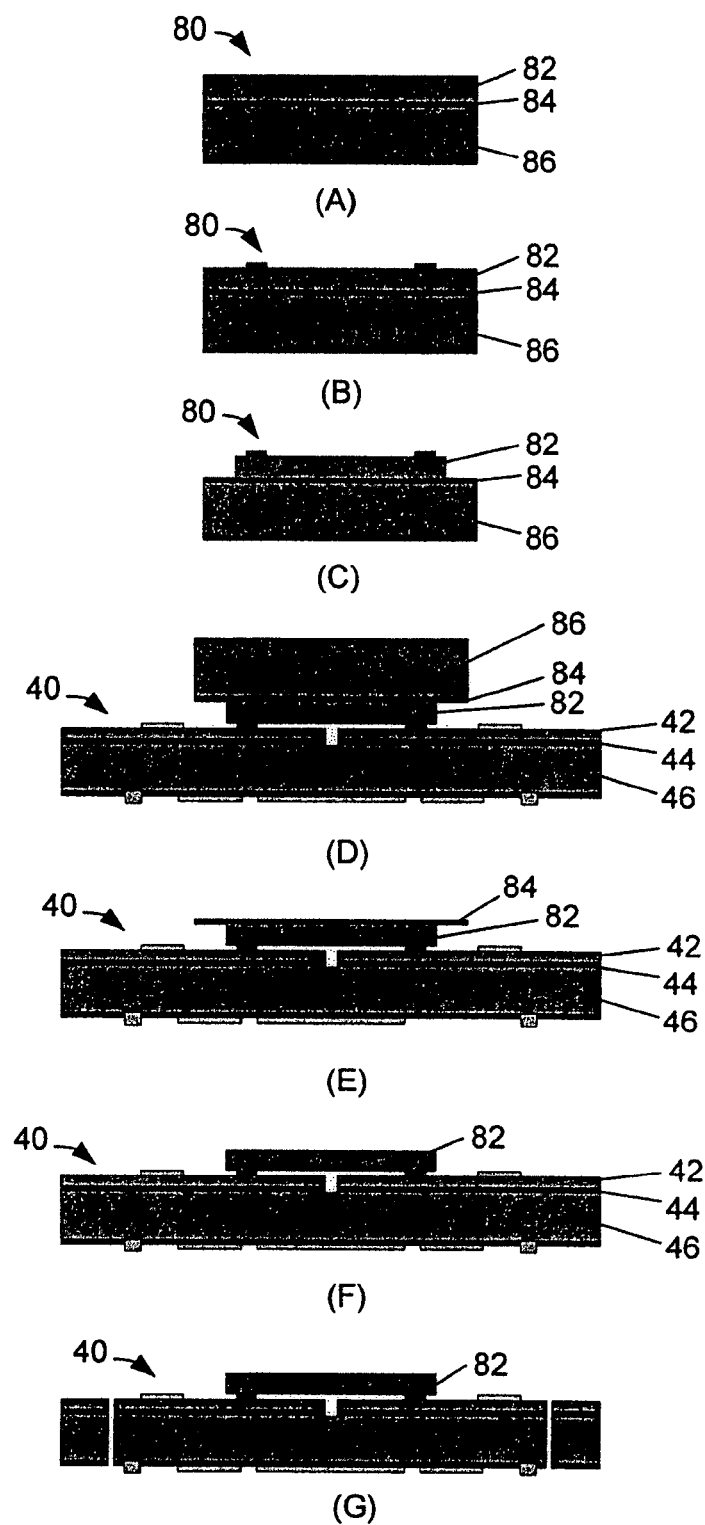
FIG. 6 is a schematic side view showing a process of manufacturing a MEMS device together with bonding the MEMS device to the interposer wafer according to another preferred embodiment of the present invention.

FIG. 6 illustrates another process that can be used to manufacture the MEMS device. The whole process also includes providing an interposer, which is the same as shown in FIG. 3, and manufacturing a MEMS device together with bonding the MEMS device to the interposer. The process of manufacturing a MEMS device together with bonding the MEMS device to the interposer starts from step (A) at the top of the figure and continues to step (G) at the bottom of the figure. At step (A), a standard SOI wafer 80 is provided, which includes a device silicon layer 82, a dielectric layer 84, which preferably is a silicon dioxide ($SiO_2$) layer, and a handle silicon layer 86. The device layer 82 has a thickness and conductivity of the MEMS device (i.e. the proof mass) that will be formed. In step (B), a mesa etch is performed on the device layer 82 to at least partially define the structure of the MEMS device. In the exemplary embodiment, structural posts 88 are defined on the device layer 82. In the next step, as shown in (C), an inductively coupled plasma (ICP) etch is performed, preferably in an STS tool, on the device silicon layer 82 to further define the MEMS device. The etch is performed through the device layer 82 and stops at the underlying oxide layer 84. In next step, as shown in (D), the wafer 80 is bonded to the interposer wafer 40. The interposer wafer 40 has been prepared in a previous manufacturing process as shown in FIG. 3. The posts 88 are bonded to the top surface of the device layer 42 of the wafer 40 preferably by direct bonding as described above. From (D) to (E), the handle layer 86 is etched away preferably by a liquid etch, which stops on the upper surface of the oxide layer 84, thus protecting the underneath device silicon layer 82 from being damaged by the etchant. From (E) to (F), the oxide layer 84 is removed by a wet or dry etch, or a combination of wet and dry etch. The etchant used to remove the oxide layer 84 preferably has a high selectivity of $SiO_2$ over silicon, so that the underneath silicon will not be attacked. In step (G), the bottom interposer wafer 40 is further etched preferably by inductively coupled plasma (ICP) to define the structure of the interposer and/or to separate the individual device from the wafer. The device is then ready to be mounted in a package.

This device also does not have the brazing materials or an intermediate substrate layer between the top layer MEMS device and the interposer as required in the prior art device for bonding the MEMS device to the interposer, and therefore, the performance of the device is improved.

Figure 7:
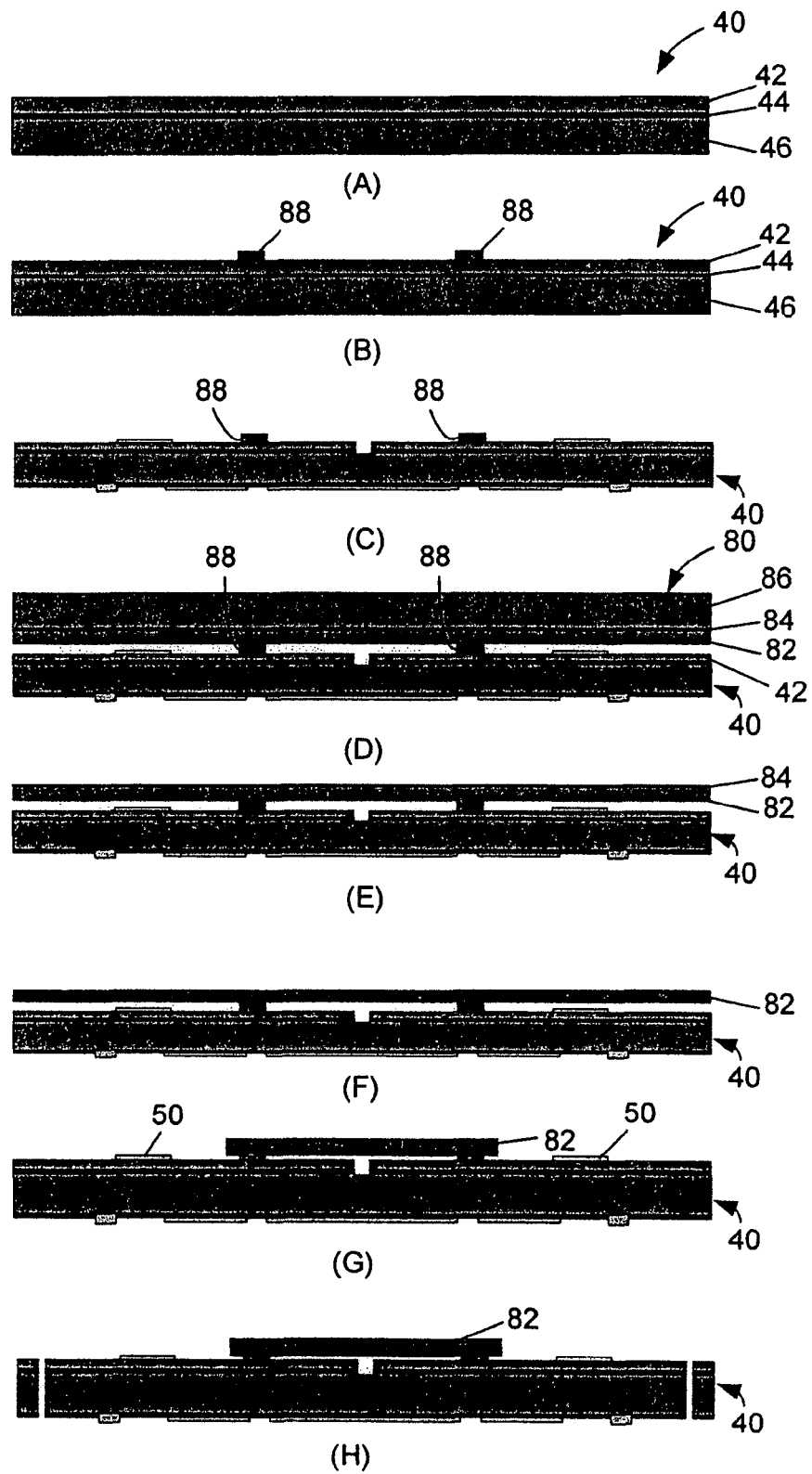
FIG. 7 is a schematic side view showing a process of manufacturing a MEMS device together with an interposer wafer according to another preferred embodiment of the present invention.

In the embodiments shown in FIGS. 4-6, the structural posts 88 are defined on the wafer that is used to form the MEMS device. Alternatively, the structural posts 88 can be defined on the interposer wafer 40. This alternative process, as illustrated in (A) in FIG. 7, starts using an SOI wafer 40 that is used to form the interposer. As shown in (B), a mesa etch is performed on the device layer 42 of the interposer wafer 40 to define structural posts 88. Then, similar to the process illustrated in FIG. 3, a thin oxide layer is formed at a bottom surface of the interposer wafer 40, one or more ohmic contacts, sensors, and one or more heaters are formed on the interposer wafer 40, and a trench is defined through the device layer 42 and the oxide layer 44 of the interposer wafer 40. As shown in (D), another SOI wafer 80, which is used to form the MEMS device, is bonded to the interposer wafer 40 with the device layer 82 of the wafer 80 facing the posts 88. From (D) to (E), after the two wafers are bonded together, the handle layer 86 of the MEMS device wafer 80 is removed by etching. From (E) to (F), the oxide layer 84 of the MEMS device wafer 80 is removed by etching. From (F) to (G), the device layer 82 of the MEMS device wafer 80 is further etched to define the MEMS device. In step (H), the bottom wafer 40 is further etched to define the structure of the interposer and/or to separate the individual device from the wafer 40.

The present disclosure has described MEMS devices and methods for producing the MEMS devices in a single device level. Such devices are typically fabricated in large numbers on a wafer of semiconductor material. The wafer scale assembly is then separated into individual devices. A person skilled in the art should appreciate that the wafer scale fabrication uses the same process as described in the specification and as claimed in the claims.

Figure 8:
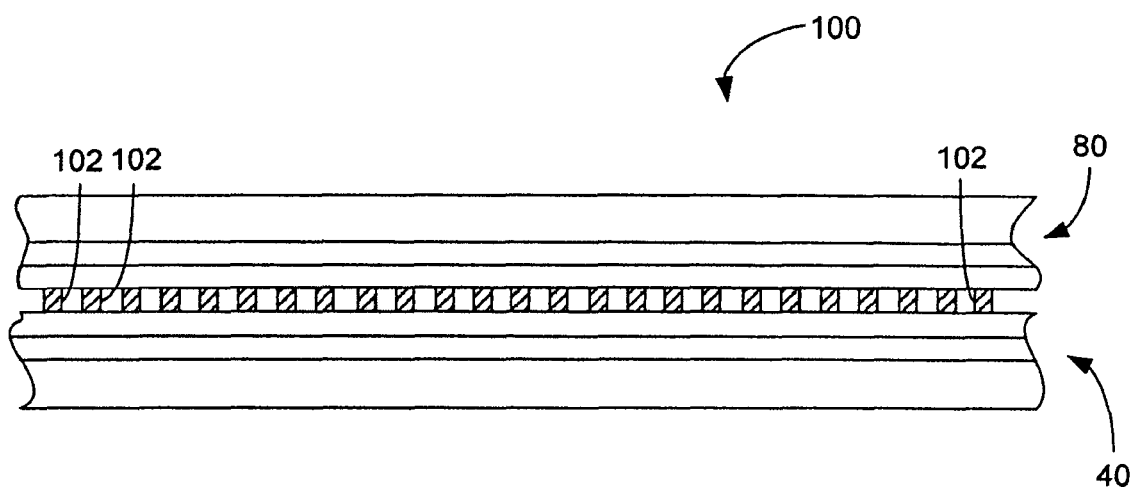
FIG. 8 is a schematic side view of a wafer scale assembly that is used to form an array of MEMS devices according to one aspect of the present invention.

FIG. 8 schematically illustrates a wafer scale assembly 100 (the figure shows part of the assembly), which includes two wafers bonded together, an SOI wafer 40 which is used to form the interposers and an SOI wafer 80 which is used to form the MEMS devices. The wafer scale assembly includes an array of structures 102 that are used to form an array of MEMS devices. The etching process of the MEMS devices in wafer scale is the same as the process described in the above paragraphs and illustrated in the figures. After the wafer scale assembly 100 is etched, an array of the MEMS devices are defined on the interposer wafer 40. The result structure is then separated into individual MEMS devices.

A person skilled in the art should understand that the processes described above and in the figures only briefly illustrate the fabrication processes, and some detailed steps are not described in the description and in the figures, for example, in any etching step, the steps of deposition of photoresist and photolithography not described in the description and figures. One skilled in the art should understand that these steps are required in the fabrication process and should appreciate the whole fabrication process from the exemplary embodiments illustrated in the present disclosure. The specification describes the steps of the preferred processes in a sequence, but a person skilled in the art should understand that it may not be necessary to perform these steps in the sequence as described, for example, step (G) in FIGS. 4 and 6 may be performed in an earlier stage.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A Microelectromechanical Systems (MEMS) apparatus produced by a method comprising:
    obtaining an SOI wafer, which comprises:
        (i) a handle layer,
        (ii) a dielectric layer on said handle layer, and
        (iii) a device layer on said dielectric layer; etching said device layer of said SOI wafer to at least partially define said MEMS device;
    obtaining an interposer wafer;
    bonding said SOI wafer to said interposer wafer in a way such that said device layer of said SOI wafer faces said interposer wafer;
    removing said handle layer of said SOI wafer; and
    removing said dielectric layer of the SOI wafer,
    wherein said interposer wafer is manufactured from an SOI wafer, wherein said interposer wafer comprises:
        (i) a handle layer,
        (ii) a dielectric layer on said handle layer, and
        (iii) a device layer on said dielectric layer.

2. The apparatus of claim 1, wherein said obtaining an interposer wafer comprises forming said interposer wafer from said SOI wafer, wherein said forming said interposer wafer from said SOI wafer comprises:
(a) forming contacts on said device layer and said handle layer of said interposer wafer; and
(b) etching said device layer and said dielectric layer of said interposer wafer to define active areas on said interposer wafer.

3. The apparatus of claim 1, comprising interconnect lines on said interposer wafer.

4. The apparatus of claim 1, wherein the method further comprises a step of forming an oxide layer at a bottom surface of said handle layer of said interposer wafer before the step of forming contacts on said device layer and said handle layer of said interposer wafer.

5. The apparatus of claim 1, comprising least one heater on said handle layer of said interposer wafer.

6. The apparatus of claim 1, further comprising at least one sensor on said handle layer of said interposer wafer.

7. A Microelectromechanical Systems (MEMS) apparatus produced by a method comprising:
obtaining a first SOI wafer, wherein said first SOI wafer comprises:
(i) a handle layer,
(ii) a dielectric layer on said handle layer, and
(iii) a device layer on said dielectric layer;
performing a mesa etch on said device layer to define at least one structural post;
obtaining a second SOI wafer, which comprises:
(i) a handle layer,
(ii) a dielectric layer on said handle layer, and
(iii) a device layer on said dielectric layer;
bonding said device layer of said second SOI wafer to said at least one structural post of said first SOI wafer;
removing said handle layer of said second SOI wafer; and
removing said dielectric layer of said second SOI wafer.

8. A Microelectromechanical Systems (MEMS) apparatus produced by a method comprising
obtaining a first SOI wafer, wherein said first SOI wafer comprises:
(i) a handle layer,
(ii) a dielectric layer on said handle layer, and
(iii) a device layer on said dielectric layer;
performing a mesa etch on said device layer to define an array of sets of structural posts, wherein each set of structural post includes at least one structural post;
obtaining a second SOI wafer, which comprises:
(i) a handle layer,
(ii) a dielectric layer on said handle layer, and
(iii) a device layer on said dielectric layer;
bonding said device layer of said second SOI wafer to said at least one structural post of said first SOI wafer;
removing said handle layer of said second SOI wafer;
removing said dielectric layer of said second SOI wafer;
etching said device layer of said second SOI wafer to define an array of said MEMS devices; and
separating the result structure into individual MEMS devices.

* * * * *